United States Patent [19]
Kim

[11] Patent Number: 5,696,725
[45] Date of Patent: Dec. 9, 1997

[54] HIGH-SPEED SENSE AMPLIFIER FOR SEMICONDUCTOR MEMORY DEVICE

[75] Inventor: Hong Seok Kim, Kyoungki-do, Rep. of Korea

[73] Assignee: Hyundai Electronics Industries Co., Ltd., Kyoungki-do, Rep. of Korea

[21] Appl. No.: 777,200

[22] Filed: Dec. 27, 1996

[30] Foreign Application Priority Data

Dec. 29, 1995 [KR] Rep. of Korea .............. 95-66042

[51] Int. Cl.[6] .................................................. G11C 7/00
[52] U.S. Cl. .............. 365/205; 365/189.09; 365/189.11; 365/190
[58] Field of Search ................................. 365/205, 154, 365/156, 190, 189.11, 189.09, 207

[56] References Cited

U.S. PATENT DOCUMENTS

| | | | |
|---|---|---|---|
| 4,910,713 | 3/1990 | Madden et al. | 365/189.11 |
| 4,982,367 | 1/1991 | Miyatake | 365/203 |
| 5,020,029 | 5/1991 | Ichinose et al. | 365/154 |
| 5,457,657 | 10/1995 | Suh | 365/205 |
| 5,477,497 | 12/1995 | Park et al. | 365/205 |
| 5,600,588 | 2/1997 | Kawashima | 365/154 |

*Primary Examiner*—David C. Nelms
*Assistant Examiner*—Hien Nguyen
*Attorney, Agent, or Firm*—Freid & Priest L.L.P.

[57] ABSTRACT

A high-speed sense amplifier for a semiconductor memory device which has a plurality of memory cells and true and complementary bit lines connected to the memory cells, comprising first and second PMOS transistors cross coupled between the true and complementary bit lines, for sensing and amplifying true and complementary data on the true and complementary bit lines, to be restored in a corresponding one of the memory cells, the first and second PMOS transistors commonly inputting a high voltage signal; first and second NMOS transistors cross coupled between the true and complementary bit lines, for sensing and amplifying true and complementary data on the true and complementary bit lines, transferred from the corresponding memory cell, the first and second NMOS transistors commonly inputting a low voltage signal; and a voltage regulation circuit for regulating a back bias voltage to the first and second NMOS transistors in response to a voltage control signal to vary threshold voltages of the first and second NMOS transistors. According to the present invention, a substrate voltage and a ground voltage are selectively used as the back bias voltage to the first and second NMOS transistors to regulate the threshold voltages of the first and second NMOS transistors.

5 Claims, 4 Drawing Sheets

HIGH-SPEED SENSE AMPLIFIER FOR SEMICONDUCTOR MEMORY DEVICE

BACKGROUND OF THE INVENTION

1. Field of the Invention

The present invention relates in general to a sense amplifier for sensing and amplifying data on a bit line in a semiconductor memory device, and more particularly to a high-speed sense amplifier in which threshold voltages of cross-coupled NMOS transistors are switched to a ground voltage before a sensing start time point to sense and amplify the data on the bit line at high speed.

2. Description of the Prior Art

Generally, a sense amplifier is provided in a semiconductor memory device to sense and amplify data on a bit line, transferred from a memory cell or to be stored therein. To this end, the sense amplifier comprises NMOS transistors. However, the NMOS transistors sense and amplify the data on the bit line at a limited speed because they are always supplied with a substrate voltage. Such a problem with the sense amplifier will hereinafter be described in detail with reference to FIG. 1.

FIG. 1 is a circuit diagram illustrating the construction of a conventional sense amplifier for a semiconductor memory device. As shown in this drawing, the conventional sense amplifier comprises first and second PMOS transistors MP1 and MP2 cross coupled between true and complementary bit lines BL and /BL, for sensing and amplifying true and complementary data on the true and complementary bit lines BL and /BL, to be restored in a memory cell 10. To this end, the first and second PMOS transistors MP1 and MP2 commonly input a high voltage signal RTO. The memory cell 10 is provided with a first NMOS transistor MN1 and a cell capacitor Cs connected in series between the true bit line BL and a cell plate voltage Vcp. The first NMOS transistor MN1 is operated in response to a signal from a word line WL. A first line capacitor Cbl1 is connected between the true bit line BL and a ground voltage Vss. A second line capacitor Cbl2 is connected between the complementary bit line /BL and the ground voltage Vss. The first and second line capacitors Cbl1 and Cbl2 model capacitances on the true and complementary bit lines BL and /BL, respectively.

The conventional sense amplifier further comprises second and third NMOS transistors MN2 and MN3 cross coupled between the true and complementary bit lines BL and /BL, for sensing and amplifying true and complementary data on the true and complementary bit lines BL and /BL, transferred from the memory cell 10. To this end, the second and third NMOS transistors MN2 and MN3 commonly input a low voltage signal /SB. The second and third NMOS transistors MN2 and MN3 are also adapted to transfer the amplified true and complementary data to true and complementary data bus lines DB and /DB through fourth and fifth NMOS transistors MN4 and MN5, respectively. The second and third NMOS transistors MN2 and MN3 are formed in a P-type well and supplied with a substrate voltage Vbb as a back bias voltage. The substrate voltage Vbb is higher in level than the ground voltage Vss. Because the second and third NMOS transistors MN2 and MN3 are supplied with the substrate voltage Vbb as the back bias voltage for data sensing and amplification, they cannot rapidly sense and amplify the true and complementary data on the true and complementary bit lines BL and /BL. The reason is that threshold voltages $V_T$ of the second and third NMOS transistors MN2 and MN3 become higher in level due to the substrate voltage Vbb.

In other words, in the case where data is transferred from the memory cell 10 on the assumption that a voltage Vs charged on the cell capacitor Cs is 3.3V and voltages precharged on the first and second line capacitors Cbl1 and Cbl2 are Vdd/2, a voltage difference $\Delta V$ between the true and complementary bit lines BL and /BL is calculated as follows:

$$V_1 = \{(Cs \times Vs) + (Vdd/2 \times Cb1)\} + (Cs + Cb1) \quad (1)$$
$$V_2 = Vdd/2$$
$$\Delta V = [\{(Cs \times Vs) + (Vdd/2 \times Cb1)\} + (Cs + Cb1)] - Vdd$$

In the above equation (1), if $Cs=30\times10^{-6}F$ and $Cbl=300\times10^{-6}F$, $\Delta V=0.18V$. Also, drain currents Id of the second and third NMOS transistors MN2 and MN3 can be expressed by the following equation (2):

$$Id = \mu_N \, Cox \, W/L \, [(V_G - V_T) \, V_{DS} - Vdd/2] \quad (2)$$

Also, the threshold voltages $V_T$ of the second and third NMOS transistors MN2 and MN3 can be expressed by the following equation (3):

$$V_T = \gamma \, [(2|\phi_P| + |V_{SB}|)^{1/2} - (2|\phi_P|)^{1/2}] \quad (3)$$

In the above equation (3), $\gamma$ is a body effect which is defined by $(\epsilon_S \, q \, Na)^{1/2}/Cox$.

As seen from the above equation (3), the threshold voltage $V_T$ in the above equation (2) is a function of the body effect $\gamma$ depending on the back bias voltage. For this reason, as the back bias voltage is raised in level, the threshold voltages $V_T$ of the second and third NMOS transistors MN2 and MN3 become higher in level, thereby causing the drain currents Id of the second and third NMOS transistors MN2 and MN3 to be reduced. As a result, the above-mentioned conventional sense amplifier has a response speed limited to a fixed value.

SUMMARY OF THE INVENTION

Therefore, the present invention has been made in view of the above problem, and it is an object of the present invention to provide a high-speed sense amplifier for a semiconductor memory device which is capable of sensing and amplifying data on a bit line at high speed.

In accordance with the present invention, the above and other objects can be accomplished by a provision of a high-speed sense amplifier for a semiconductor memory device which has a plurality of memory cells and true and complementary bit lines connected to the memory cells, comprising first and second PMOS transistors cross coupled between the true and complementary bit lines, for sensing and amplifying true and complementary data on the true and complementary bit lines, to be restored in a corresponding memory cell, the first and second PMOS transistors commonly inputting a high voltage signal; first and second NMOS transistors cross coupled between the true and complementary bit lines, for sensing and amplifying true and complementary data on the true and complementary bit lines, transferred from the corresponding memory cell, the first and second NMOS transistors commonly inputting a low voltage signal; and voltage regulation means for regulating a back bias voltage to the first and second NMOS transistors in response to a voltage control signal to vary threshold voltages of the first and second NMOS transistors.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF A PREFERRED EMBODIMENTS

Figure 2:
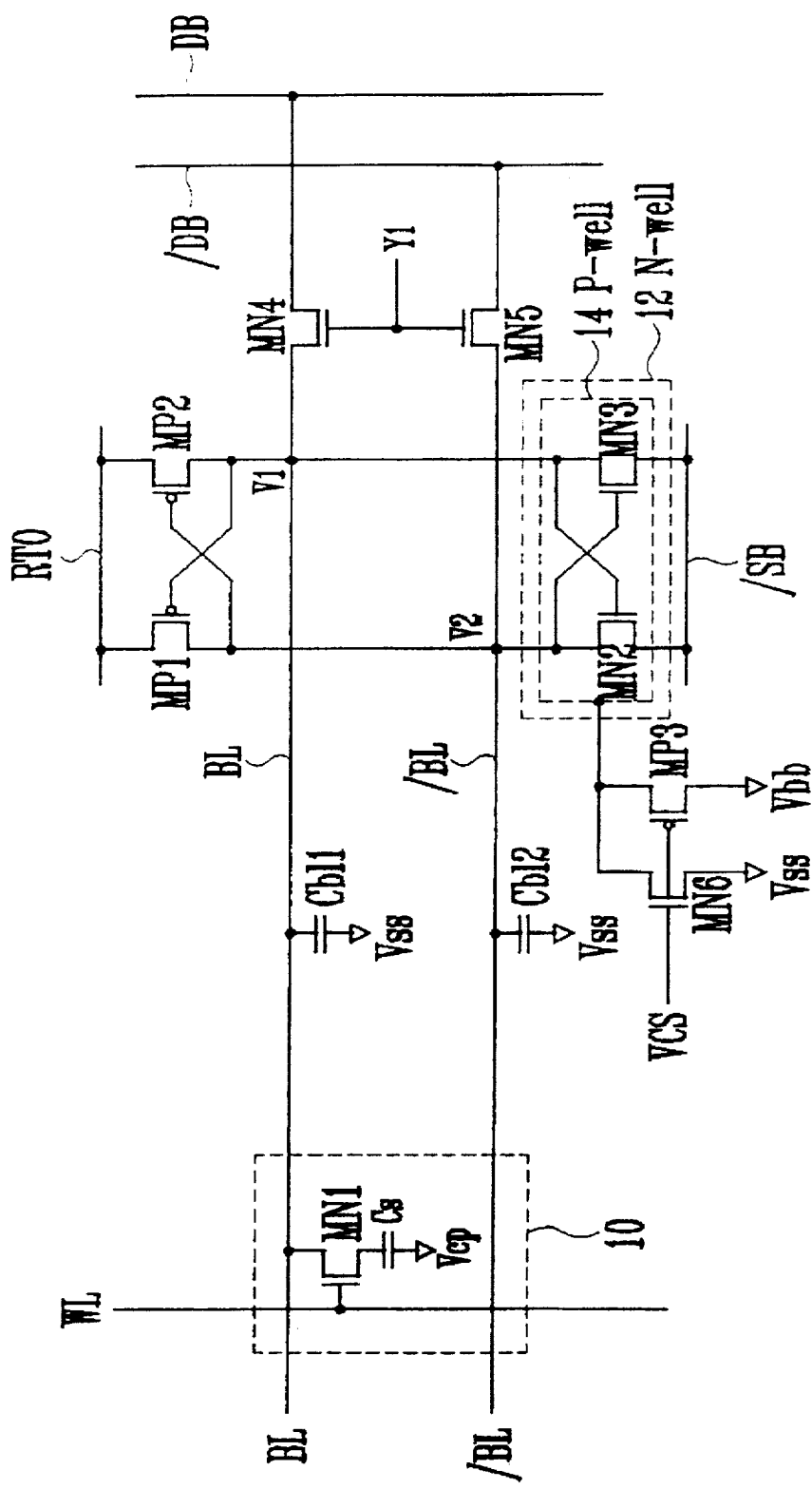
FIG. 2 is a circuit diagram illustrating the construction of a high-speed sense amplifier for a semiconductor memory device in accordance with an embodiment of the present invention.

FIG. 2 is a circuit diagram illustrating the construction of a high-speed sense amplifier for a semiconductor memory device in accordance with an embodiment of the present invention. As shown in this drawing, the high-speed sense amplifier comprises first and second PMOS transistors MP1 and MP2 cross coupled between true and complementary bit lines BL and /BL, for sensing and amplifying true and complementary data on the true and complementary bit lines BL and /BL, to be restored in a memory cell 10. To this end, the first and second PMOS transistors MP1 and MP2 commonly input a high voltage signal RTO. The memory cell 10 is provided with a first NMOS transistor MN1 and a cell capacitor Cs connected in series between the true bit line BL and a cell plate voltage Vcp. The first NMOS transistor MN1 is operated in response to a signal from a word line WL. A first line capacitor Cbl1 is connected between the true bit line BL and a ground voltage Vss, and a second line capacitor Cbl2 is connected between the complementary bit line /BL and the ground voltage Vss. The first and second line capacitors Cbl1 and Cbl2 model capacitances on the true and complementary bit lines BL and /BL, respectively. The high voltage signal RTO has half a supply voltage level Vdd, namely, Vdd/2 (referred to hereinafter as half voltage level) in a standby mode and the supply voltage level Vdd in a data sensing/amplification mode.

The high-speed sense amplifier further comprises second and third NMOS transistors MN2 and MN3 cross coupled between the true and complementary bit lines BL and /BL, for sensing and amplifying true and complementary data on the true and complementary bit lines BL and /BL, transferred from the memory cell 10. To this end, the second and third NMOS transistors MN2 and MN3 commonly input a low voltage signal /SB. The second and third NMOS transistors MN2 and MN3 are also adapted to transfer the amplified true and complementary data to true and complementary data bus lines DB and /DB through fourth and fifth NMOS transistors MN4 and MN5, respectively. In accordance with the preferred embodiment of the present invention, the second and third NMOS transistors MN2 and MN3 are formed on the upper side of a P-type well 14, the lower side of which is surrounded by an N-type well 12. The low voltage signal /SB has the half voltage level Vdd/2 in the standby mode and the ground voltage level Vss in the data sensing/ amplification mode.

The high-speed sense amplifier further comprises a third PMOS transistor MP3 for selectively supplying a substrate voltage Vbb to the P-type well 14, and a sixth NMOS transistor MN6 for selectively supplying the ground voltage Vss to the P-type well 14. The third PMOS transistor MP3 and sixth NMOS transistor MN6 have gates for commonly inputting a voltage control signal VCS which is low in logic in the standby mode and high in logic in the data sensing/ amplification mode. The voltage control signal VCS may be produced by delaying a row address strobe signal RAS for a proper time.

In the standby mode where the voltage control signal VCS is low in logic, the third PMOS transistor MP3 is turned on to supply the substrate voltage Vbb to the P-type well 14. As a result, threshold voltages $V_T$ of the second and third NMOS transistors MN2 and MN3 become higher in level.

In contrast, in the data sensing/amplification mode where the voltage control signal VCS is high in logic, the sixth NMOS transistor MN6 is turned on to supply the ground voltage Vss to the P-type well 14 instead of the substrate voltage Vbb. The ground voltage Vss supplied to the P-type well 14 lowers the threshold voltages $V_T$ of the second and third NMOS transistors MN2 and MN3 while increasing drain currents Id thereof, thereby amplifying the true and complementary data on the true and complementary bit lines BL and /BL at high speed. In other words, the third PMOS transistor MP3 and sixth NMOS transistor MN6 function to regulate a back bias voltage to the second and third NMOS transistors MN2 and MN3.

Figure 1:
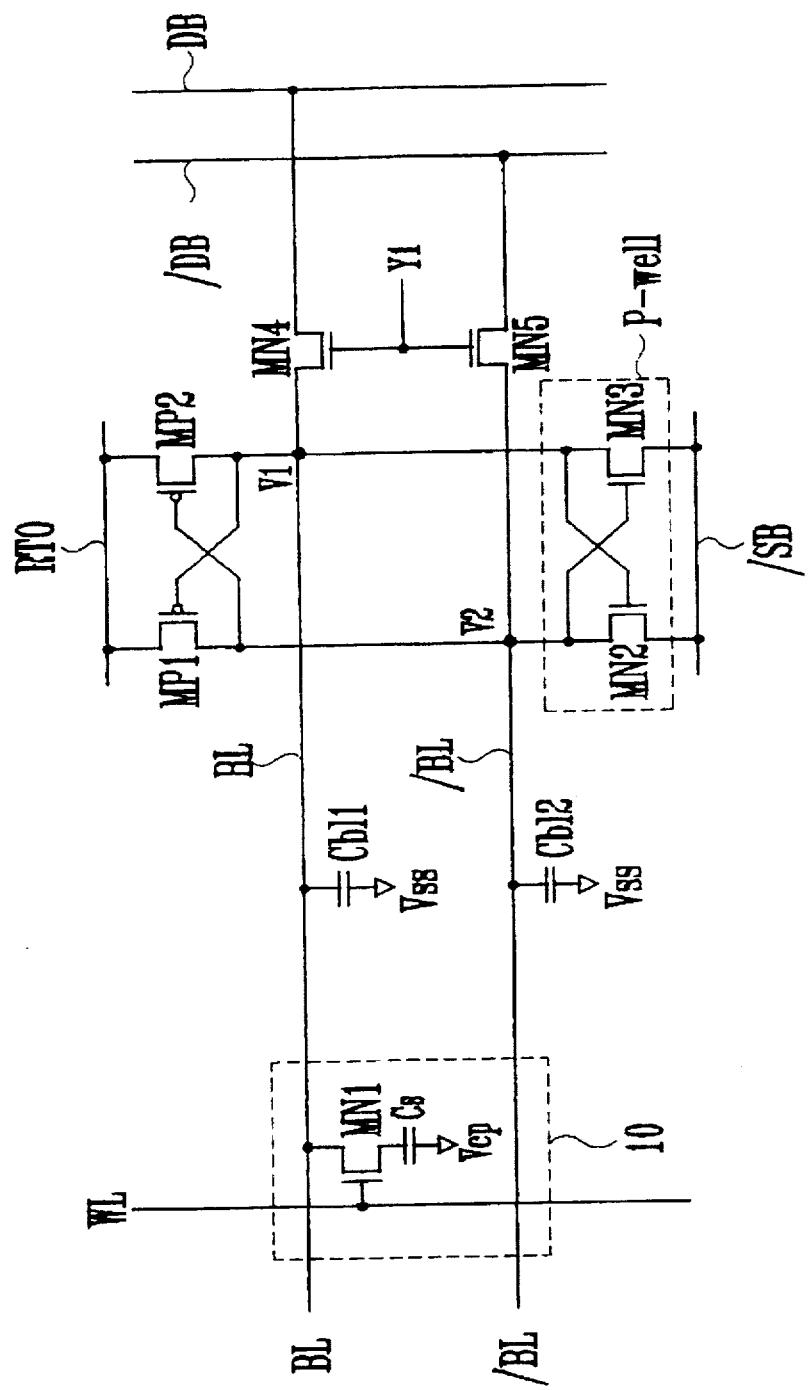
FIG. 1 is a circuit diagram illustrating the construction of a conventional sense amplifier for a semiconductor memory device.
Figure 3:
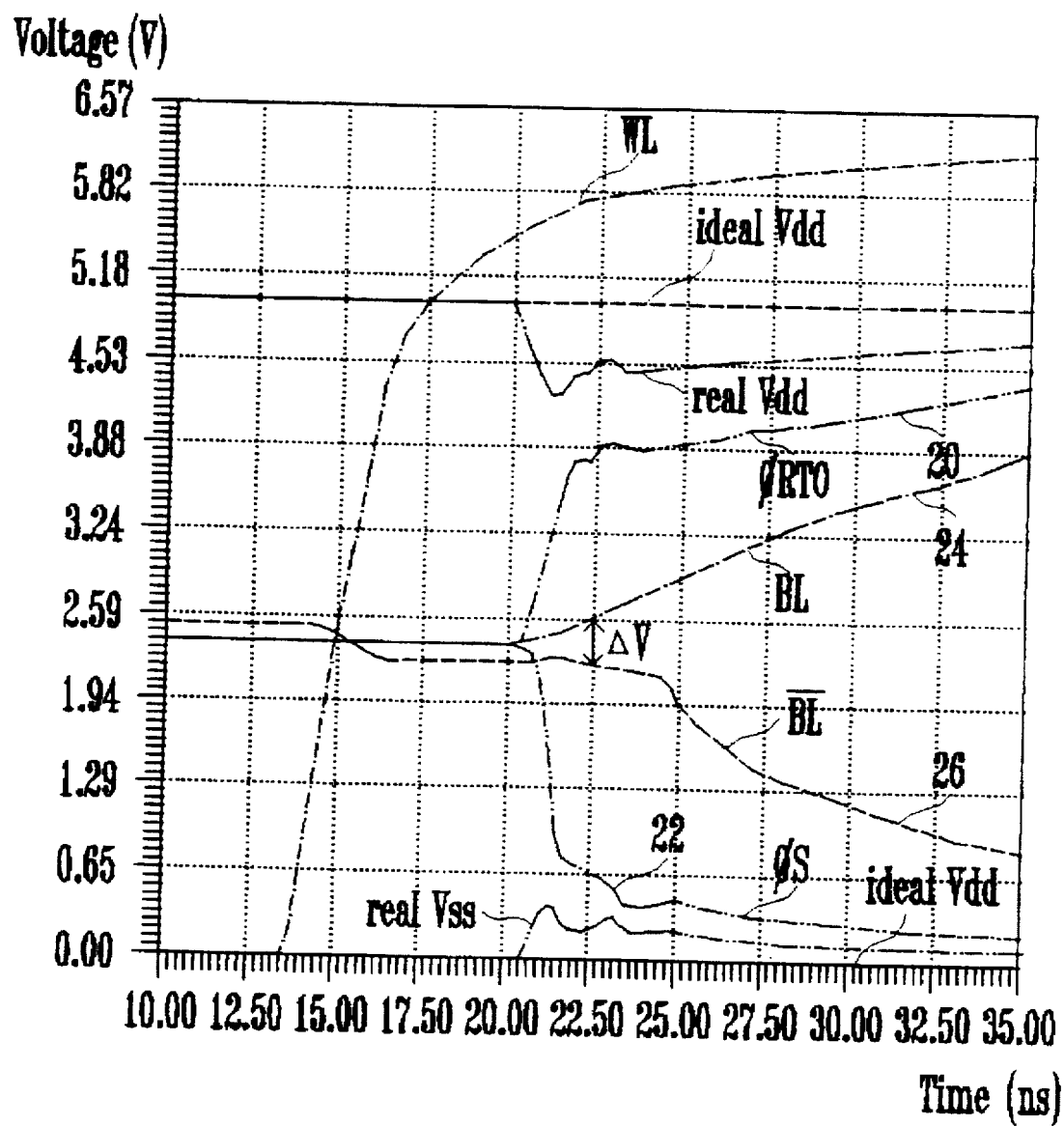
FIG. 3 is a view illustrating a data response characteristic of the conventional sense amplifier in FIG. 1.

FIG. 3 is a view illustrating a data response characteristic of the conventional sense amplifier in FIG. 1. In this drawing, the curves 20 and 22 show the high and low voltage signals RTO and /SB supplied to the sense amplifier, respectively, and the curves 24 and 26 show voltage variations on the true and complementary bit lines BL and /BL, respectively.

Figure 4:
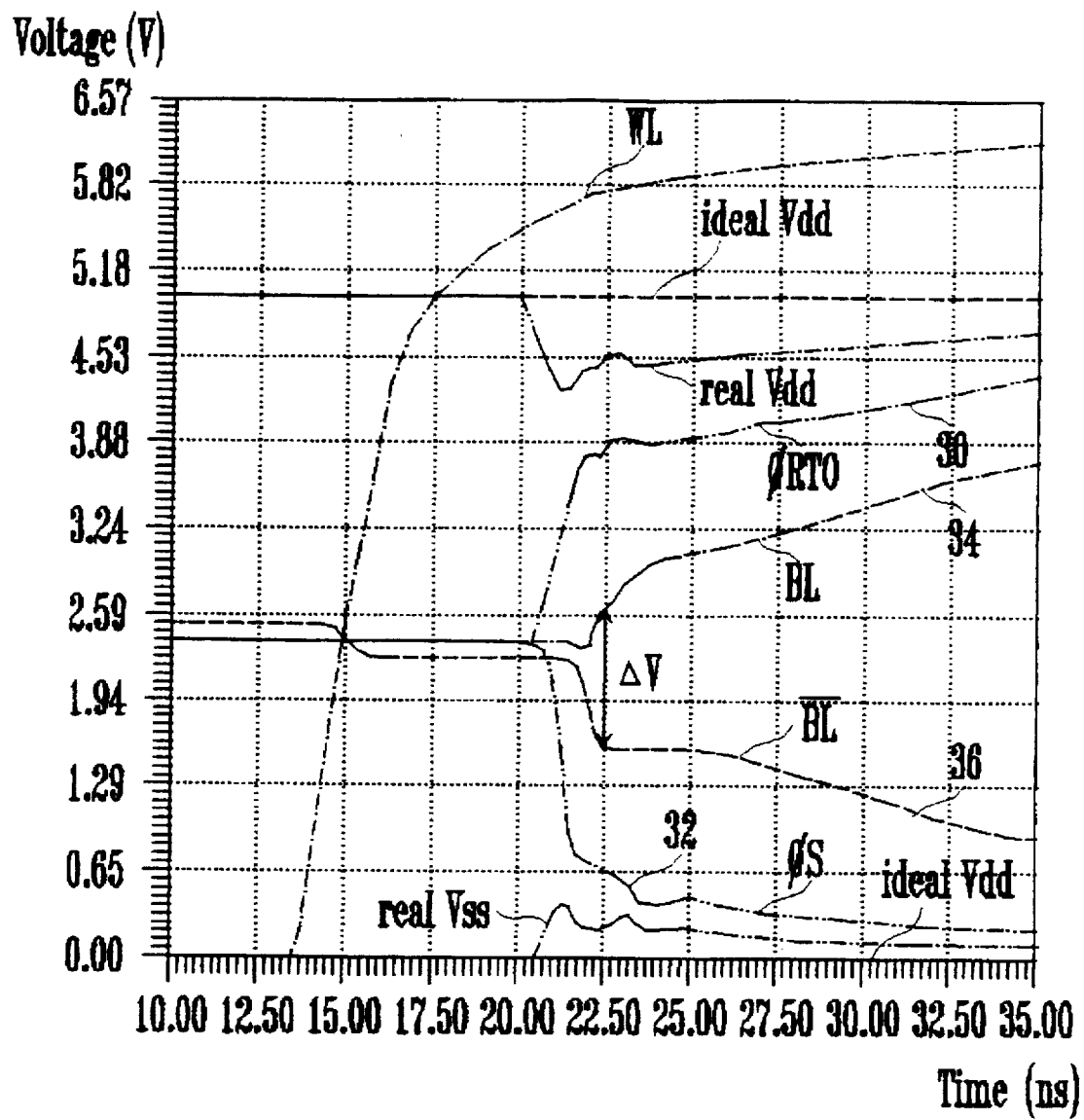
FIG. 4 is a view illustrating a data response characteristic of the high-speed sense amplifier in FIG. 3.

FIG. 4 is a view illustrating a data response characteristic of the high-speed sense amplifier in FIG. 3. In this drawing, the curves 30 and 32 show the high and low voltage signals RTO and /SB supplied to the sense amplifier, respectively, and the curves 34 and 36 show voltage variations on the true and complementary bit lines BL and /BL, respectively.

As shown in FIG. 3, the conventional sense amplifier in FIG. 1 can transfer the amplified true and complementary data to the true and complementary bit lines BL and /BL after the lapse of at least 50 ns from a time point that the high and low voltage signals RTO and /SB are supplied. However, as shown in FIG. 4, the present high-speed sense amplifier in FIG. 2 can transfer the amplified true and complementary data to the true and complementary bit lines BL and /BL within at least 25 ns from the time point that the high and low voltage signals RTO and /SB are supplied.

As is apparent from the above description, according to the present invention, the substrate voltage and ground voltage are selectively used as the back bias voltage to the NMOS transistors to regulate the threshold voltages of the NMOS transistors. Therefore, the high-speed sense amplifier of the present invention has the effect of sensing and amplifying the data on the bit line at a speed at least twice as high as that of the conventional sense amplifier.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A high-speed sense amplifier for a semiconductor memory device which has a plurality of memory cells and true and complementary bit lines connected to said memory cells, comprising:

first and second PMOS transistors cross coupled between said true and complementary bit lines, for sensing and amplifying true and complementary data on said true and complementary bit lines, to be restored in a corresponding one of said memory cells, said first and second PMOS transistors commonly inputting a high voltage signal;

first and second NMOS transistors cross coupled between said true and complementary bit lines, for sensing and amplifying true and complementary data on said true and complementary bit lines, transferred from said corresponding memory cell, said first and second NMOS transistors commonly inputting a low voltage signal; and voltage regulation means for regulating a back bias voltage to said first and second NMOS transistors in response to a voltage control signal to vary threshold voltages of said first and second NMOS transistors.

2. A high-speed sense amplifier for a semiconductor memory device, as set forth in claim 1, wherein said voltage control means includes:

first switching means being selectively driven in response to said voltage control signal, for supplying a substrate voltage as said back bias voltage to said first and second NMOS transistors; and second switching means being driven complementarily to said first switching means in response to said voltage control signal, for supplying a ground voltage as said back bias voltage to said first and second NMOS transistors.

3. A high-speed sense amplifier for a semiconductor memory device, as set forth in claim 2, wherein said first switching means are driven in a standby mode and said second switching means are driven in a data sensing/ amplification mode.

4. A high-speed sense amplifier for a semiconductor memory device, as set forth in claim 3, wherein said first switching means include a PMOS transistor and said second switching means include an NMOS transistor.

5. A high-speed sense amplifier for a semiconductor memory device, as set forth in claim 4, wherein said voltage control signal is produced by delaying a row address strobe signal for a proper time.

* * * * *